United States Patent
Blixhavn

(10) Patent No.: US 7,615,845 B1
(45) Date of Patent: Nov. 10, 2009

(54) ACTIVE SHIELDING OF CONDUCTORS IN MEMS DEVICES

(75) Inventor: Bjørn Blixhavn, Tønsberg (NO)

(73) Assignee: Infineon Technologies SensoNor AS, Horten (NO)

( * ) Notice: Subject to any disclaimer, the term of this patent is extended or adjusted under 35 U.S.C. 154(b) by 0 days.

(21) Appl. No.: 12/146,144

(22) Filed: Jun. 25, 2008

(51) Int. Cl.
*H01L 21/761* (2006.01)
*H01L 23/58* (2006.01)

(52) U.S. Cl. .............. 257/545; 438/414; 257/E21.544; 257/E23.079; 257/E23.002

(58) Field of Classification Search .............. 257/545; 438/414

See application file for complete search history.

(56) References Cited

U.S. PATENT DOCUMENTS 6,611,168 B1 * 8/2003 Denison et al. .............. 330/4.5

* cited by examiner

*Primary Examiner*—Evan Pert
(74) *Attorney, Agent, or Firm*—Edell, Shapiro, Finnan, LLC

(57) ABSTRACT

An apparatus that reduces parasitic capacitance in a MEMS device includes a dielectric layer on the surface of a silicon-on-insulator (SOI) substrate, a conductor embedded in the substrate and disposed between the dielectric layer and a buried oxide layer, and surface conductors on the dielectric layer and coupled to ends of the embedded conductor. A boundary region surrounds the embedded conductor and separates an inner region and an outer region of substrate, providing a p-n junction between the boundary region and the outer region of SOI substrate which is reverse biased to electrically isolate the inner region from the outer region of SOI substrate. An amplifier has an input connected to one end of the embedded conductor and an output connected to the inner region of the substrate. The amplifier senses a voltage at the input and produces a voltage that approximates the voltage at the output.

14 Claims, 3 Drawing Sheets

ACTIVE SHIELDING OF CONDUCTORS IN MEMS DEVICES

FIELD OF THE INVENTION

The present invention relates to micro-electromechanical system (MEMS) devices, manufactured on a semiconductor substrate and including both mechanical and electrical structures. In particular, the present invention relates to the reduction of parasitic capacitance that is present within such devices.

BACKGROUND

There are many different MEMS devices used today, for example pressure sensors, pump actuators and electrical or optical circuit elements, such as RF inductors, optical switches and resonators, to name but a few.

Many MEMS devices use capacitive circuit elements to perform an intended function. The capacitive circuit elements of such MEMS device are connected by conductors to electronic circuits, which may be placed on the same substrate as the MEMS device, or on a separate integrated circuit. In either case, capacitance associated with the conductors will be present. This capacitance, which is often called parasitic capacitance, will be electrically in parallel with the capacitive circuit elements of the MEMS device.

In addition, capacitive MEMS devices sometimes need to have signals routed via diffused conductors, instead of via metal conductors. An example might be when wafer-scale packaging is used, whereby a top wafer is bonded to the sensor wafer by one of several techniques, such as anodic bonding or direct silicon wafer bonding. Conductors are then required to cross the bonding area below the wafer surface, since a flat wafer surface without metal conductors is required for successful bonding. Another example would be conductors on thin membranes, where using a metal could cause hysteresis. However, the capacitance of the back-biased junction, which is generally employed to isolate the conductor from the substrate, appears as parasitic capacitance in parallel with the sensing capacitance, impairing performance.

Accordingly, MEMS devices, which use resistive or inductive circuit elements to perform their intended function, may also have their performance impaired by the parasitic capacitance. This is because the parasitic capacitance causes reduced sensitivity, increased noise gain and/or reduced sensor bandwidth. It is therefore desirable to reduce the parasitic capacitance present in a MEMS device.

One of the factors that influence the amount of parasitic capacitance is the total area of the diffused conductors. Previously, this problem has been handled by keeping the area of the diffused conductors to a minimum, for example limiting the length of the conductors by placing the associated electronics close to the MEMS device, or using narrow conductors. However, the use of narrow diffused conductors leads to higher resistance, which also has negative effects.

Furthermore, the mechanical dimensions of the MEMS device are often determined by factors other than the electrical parameters, and this restricts the possibility to reduce conductor area. One example of particular relevance is the use of anodic bonding in MEMS devices. This technique requires a bonding area of a certain width, which must be crossed by conductors which carry electrical signals from the hermetically sealed MEMS device to outside electrical contacts.

Although circuit topologies, such as those provided on an electronic amplifier, can differ in their sensitivity to parasitic capacitance, and although several circuits have been suggested as being improvements in this respect, in many cases parasitic capacitance remains detrimental to system performance.

SUMMARY

According to the present invention there is provided an apparatus for reducing, in use, parasitic capacitance in a conductor in a micro-electro mechanical system (MEMS) device. The apparatus comprises: a silicon-on-insulator (SOI) substrate having a buried oxide layer; a dielectric layer formed on the surface of the SOI substrate; a conductor embedded in the SOI substrate and disposed between the dielectric layer and the buried oxide layer, the embedded conductor having a first end and a second end; one or more surface conductors deposited on top of the dielectric layer and in contact with the first end and second end of the embedded conductor, respectively; a boundary region surrounding the embedded conductor and separating an inner region and an outer region of SOI substrate, the boundary extending through the SOI substrate to the buried oxide layer and providing a p-n junction between the boundary region and the outer region of SOI substrate which is, in use, reverse biased to electrically isolate the inner region from the outer region of SOI substrate; and an amplifier having an input connected to the first end of the embedded conductor and an output connected to the inner region of the SOI substrate, the amplifier configured to sense a voltage at the input and to reproduce a voltage equal to, or approximating, the voltage at the output.

According to the present invention there is also provided a method of reducing, in use, parasitic capacitance in a conductor in a micro-electro mechanical system (MEMS) device. The method comprises: providing a silicon-on-insulator (SOI) substrate having a buried oxide layer; forming a dielectric layer on the surface of the SOI substrate; embedding a conductor in the SOI substrate, the embedded conductor being disposed between the dielectric layer and the buried oxide layer and having a first end and a second end; depositing one or more surface conductors on top of the dielectric layer, the surface conductors being in contact with the first end and second end of the embedded conductor, respectively; forming a boundary region, which surrounds the embedded conductor and separates an inner region and an outer region of SOI substrate, the boundary region extending through the SOI substrate to the oxide layer and providing a p-n junction between the boundary region and the outer region of SOI substrate, which is reverse biased, in use, to electrically isolate the inner region from the outer region of SOI substrate; connecting an amplifier having an input at the first end of the embedded conductor and an output at the inner region of the SOI; and reproducing at the output a voltage equal to, or approximating, a voltage sensed at the input.

Accordingly, the present invention provides an apparatus and method of reducing the parasitic capacitance in conductors used in MEMS devices, which are manufactured on silicon-on-insulator (SOI) substrates. SOI substrates are silicon substrates that have a buried layer of silicon oxide below the surface. This sort of substrate is often used for MEMS devices, as it aids in the processing of the micromechanical structures.

By taking advantage of the insulated oxide layer found in devices built on SOI wafers, the region surrounding the conductor can be electrically isolated from the rest of the silicon. It is then possible to bias this region to a voltage equal to, or very close to, the voltage of the conductor. The effect of this is that it reduces the charge on the parasitic capacitor and, to the surrounding circuits, it appears that the parasitic capacitance has been reduced.

BRIEF DESCRIPTION OF THE DRAWINGS

The present invention will now be described in detail, with reference to the following figures, in which.

DETAILED DESCRIPTION

Figure 1:
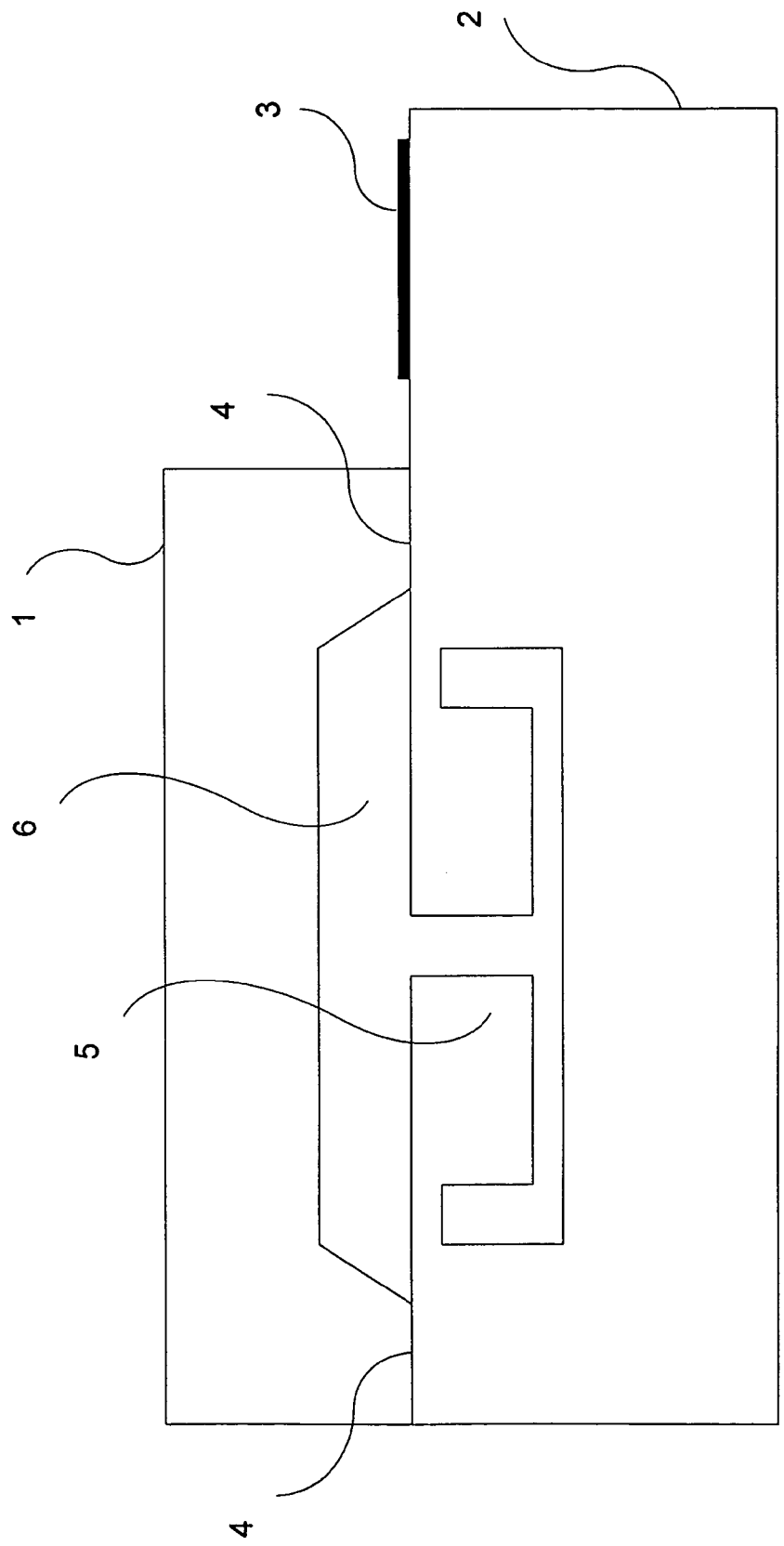
FIG. 1 is a cross-section of an example of a hermetically sealed MEMS device manufactured using a wafer bonding technique.

In the example of FIG. 1, a micro-mechanical structure 5 is manufactured from a semiconductor substrate 2, which may comprise silicon and may be doped. A bonding area 4 separates the micro-mechanical structure 5 from a bonding pad 3. Using a wafer bonding technique, such as anodic bonding, a top wafer 1 is bonded to the silicon to form a hermetic cavity 6 about the micro-mechanical structure 5. In order to electrically connect the micro-mechanical structure 5 to the bonding pads 3, an electrical conductor (not shown) must cross the bonding area 4.

The method of bonding is not essential to the invention, although it is a requirement that a insulating (dielectric) layer (not shown) is present in the bonding area 4. An insulating layer is present in most bonding technologies, and typically consists of glass or silicon oxide.

Figure 2:
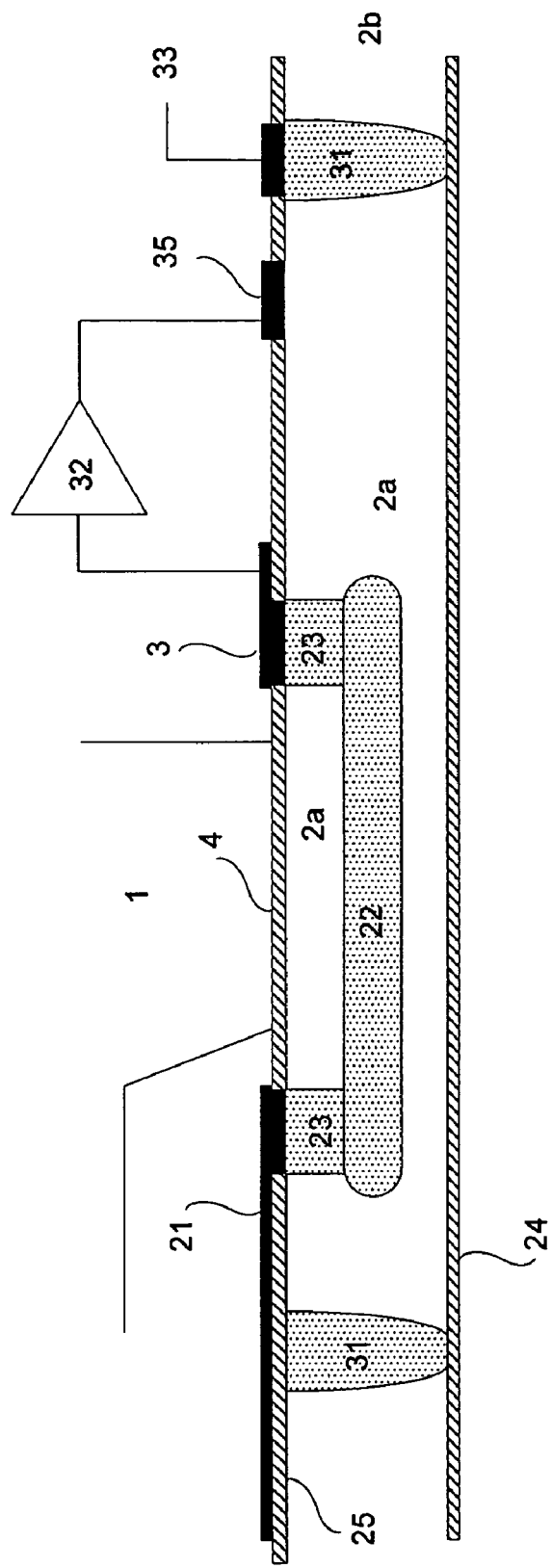
FIG. 2 is a cross-section showing a embedded conductor crossing a bonding area according to the present invention.

FIG. 2 shows an example of a substrate having an embedded conductor 22 according to the present invention. A dielectric layer 25, which may be made of silicon oxide, is formed on the surface of a Silicon-on-Insulator (SOI) substrate 2 and a conductor 22 is embedded in the SOI substrate 2. In this example, the conductor is embedded in the SOI substrate 2 underneath a bonding area 4 provided on the surface of the dielectric layer 25, the bonding area 4 being located in between the ends of the embedded conductor 22.

A small area of dielectric layer 25 may be etched away at selected locations so that contacts can be formed with the SOI substrate 2 or the embedded conductor 22. These openings in the dielectric layer 25 are generally called contact holes.

Using a wafer bonding technique, such as anodic bonding, a top wafer 1 is mounted onto the bonding area 4 of the SOI substrate 2 to create a hermetically sealed cavity 6 containing a MEMS structure (not shown) and hence separating the ends of the embedded conductor 22. The top wafer 1 is preferably glass, although other suitable materials may also be used.

Surface conductors 3, 21, which are preferably metallic, are provided on the surface of the dielectric layer 25 for connecting to the ends of the embedded conductor 22. In this example, a surface conductor 21 connects an end of the embedded conductor 22 to the MEMS structure sealed inside the cavity 6. Another surface connector 3 connects to the other end of the embedded conductor 22. The surface conductors 3, 21 connect to the embedded conductor 22 via the contact holes formed in the dielectric layer 25 and are isolated from the rest of the SOI substrate 2 by the dielectric layer 25.

A signal may be carried across the embedded conductor 22, in this example, underneath a bonding area 4. When the embedded conductor 22 is buried in the SOI substrate 2, such as in the example shown in FIG. 2, contact between the embedded conductor 22 and the surface conductors 3, 21 (or other connection means) may be facilitated by the provision of contact diffusions 23, which extend through the SOI substrate 2 from the ends of the embedded conductor 22 to the surface of the SOI substrate 2 where the contact holes are provided.

Although in the example shown in FIG. 2 the conductor 22 is embedded within the SOI substrate 2, it should be recognized that the present invention could also be realized with a conductor located at the surface of the SOI substrate 2, directly underneath and in physical contact with the dielectric layer 25.

The volumes of the embedded conductor 22 and contact diffusions 23 have the opposite doping polarity of the SOI substrate 2, so that electrical isolation can be provided by reverse biasing of the p-n junction thus created. However, this p-n junction is also a source of parasitic capacitance.

In order to reduce the parasitic capacitance, a diffusion boundary 31, which extends from the surface of the SOI substrate 2 down to a buried oxide layer 24 in the SOI substrate, surrounds the embedded conductor 22 and contact diffusions 23, separating an inner region 2a of SOI substrate 2, which contains the embedded conductor 22, and an outer region 2b of SOI substrate 2. A contact hole is provided through the dielectric layer 25 directly above a portion of the diffused boundary 31 that is not inside the sealed cavity 6.

By applying a bias voltage 33 to the diffusion boundary 31 via the contact hole, the p-n junction that is created between the diffusion boundary 31 and the SOI substrate 2 can be reverse biased, thereby electrically isolating the inner region 2a of the SOI substrate from the outer region 2b of the SOI substrate 2.

An amplifier 32 can then be employed to sense the voltage of the embedded conductor 22, preferably via the conductor 3 connected to the contact diffusion 23. The amplifier 32 then reproduces this voltage, or a close approximation to it, at an output that is connected to the inner region 2a of SOI substrate 2. According to the present invention, a contact hole is provided through the dielectric layer 25 to the surface of the SOI substrate 2 at a point inside the inner region 2a and a substrate contact 35 is provided for the amplifier 32 output to connect to.

By reproducing the voltage of the embedded conductor 22, the inner region 2a of SOI substrate 2 can be biased to a voltage close to the voltage of the conductor 22. The effect of this is that the charge on the parasitic capacitor is reduced and, to the surrounding circuits, it appears that the parasitic capacitance has been reduced. This effectively reduces the parasitic capacitance between the conductor 22 and the SOI substrate 2.

The location of the amplifier 32 is not essential to the present invention. For example, it can be located on the same SOI substrate 2 as the MEMS structure 5, or it can be placed off chip and connected via bonding pads (not shown).

Figure 3:
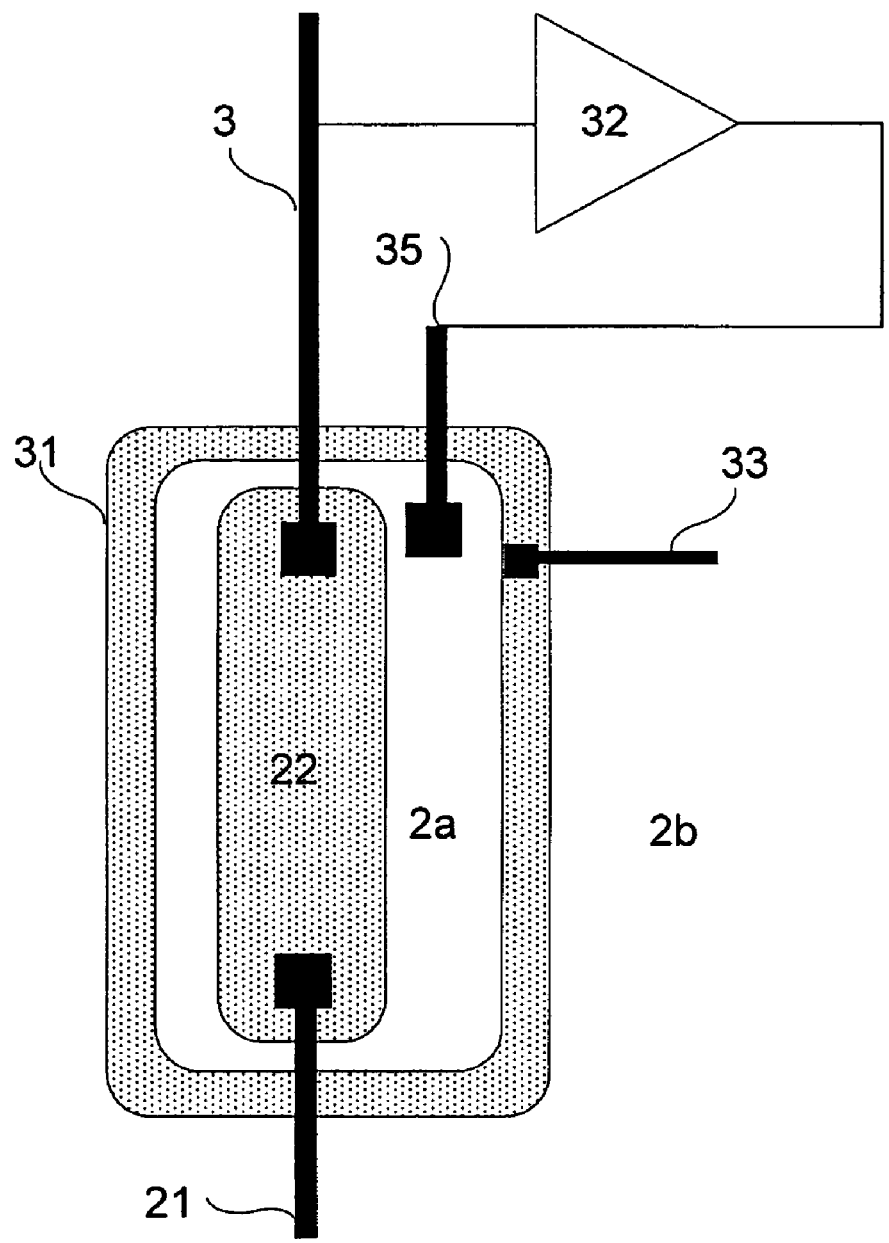
FIG. 3 shows a top view of the bonding area and surrounding substrate of FIG. 2.

FIG. 3 shows a top schematic view of the present invention, where a diffusion boundary 31 surrounds the embedded contact 22, thereby creating an inner region 2a of SOI substrate 2 and an outer region 2b of SOI substrate 2. It can also be seen how a bias voltage 33 may be applied to the diffusion boundary 31. Furthermore, it can be seen how the amplifier 32 has an input at the first end of the embedded conductor 22 and an output located on the inner region 2a of SOI substrate 2, in this example the output being connected via the substrate contact 35.

It should be noted that both the amplifier 32 and the bias voltage are connected to the inner region 2a of the SOI substrate 2 and the diffusion boundary 31 at locations outside of the area that would be hermetically sealed by the bonding of a top wafer 1 onto a bonding area 4 of the SOI substrate 2.

What is claimed is:

1. An apparatus for reducing parasitic capacitance in a conductor in a micro-electro mechanical system (MEMS) device, the apparatus comprising:
    a silicon-on-insulator (SOI) substrate having a buried oxide layer;
    a dielectric layer formed on the surface of the SOI substrate;
    a conductor embedded in the SOI substrate and disposed between the dielectric layer and the buried oxide layer, the embedded conductor having a first end and a second end;
    one or more surface conductors deposited on top of the dielectric layer and in contact with the first end and second end of the embedded conductor, respectively;
    a boundary region surrounding the embedded conductor and separating an inner region and an outer region of the SOI substrate, the boundary extending through the SOI substrate to the buried oxide layer and providing a p-n junction between the boundary region and the outer region of the SOI substrate, which is reverse biased to electrically isolate the inner region from the outer region of SOI substrate; and
    an amplifier having an input connected to the first end of the embedded conductor and an output connected to the inner region of the SOI substrate, the amplifier configured to sense a voltage at the input and to reproduce a voltage approximately equal to the voltage at the output.

2. The apparatus according to claim 1, wherein the SOI substrate has a first polarity, and the embedded conductor comprises a doped volume of the SOI substrate with a second, opposite polarity, the doped volume being located at the surface of the SOI substrate and being delimited by the SOI substrate of the first polarity and by the dielectric layer formed on the surface of the SOI substrate.

3. The apparatus according to claim 1, wherein the SOI substrate has a first polarity, and the embedded conductor comprises a doped volume of the SOI substrate with to a second, opposite polarity, the doped volume being located within the SOI substrate and being delimited on all sides by the SOI substrate of the first polarity.

4. The apparatus according to claim 1, further comprising contact holes respectively disposed in the dielectric layer at the first and second ends of the embedded conductor, the contact holes having contact diffusions which connect the first and second ends of the embedded conductor, respectively, to the surface conductors.

5. The apparatus according to claim 1, further comprising:
    a bonding area on the surface of the dielectric layer, the bonding area being located between the first and second ends of the embedded conductor; and
    a top wafer sealed onto the bonding area via wafer bonding to create a hermetically sealed cavity containing the second end of the embedded conductor.

6. The apparatus according to claim 1, wherein the SOI substrate is thinned to form a mechanically sensitive membrane in the area containing the embedded resistor.

7. The apparatus according to claim 1, wherein the amplifier is integrated on the SOI substrate.

8. A method of reducing parasitic capacitance in a conductor in a micro-electro mechanical system (MEMS) device, the method comprising:
    forming a dielectric layer on a surface of a silicon-on-insulator (SOI) substrate having a buried oxide layer;
    embedding a conductor in the SOI substrate, the embedded conductor being disposed between the dielectric layer and the buried oxide layer and having a first end and a second end;
    depositing one or more surface conductors on top of the dielectric layer, the surface conductors being electrically coupled to the first end and second ends of the embedded conductor, respectively;
    forming a boundary region that surrounds the embedded conductor and separates an inner region and an outer region of the SOI substrate, the boundary region extending through the SOI substrate to the oxide layer and providing a p-n junction between the boundary region and the outer region of SOI substrate, the p-n junction being reverse biased to electrically isolate the inner region from the outer region of SOI substrate;
    connecting an amplifier having an input at the first end of the embedded conductor and an output at the inner region of the SOI; and
    reproducing at the output a voltage approximating a voltage sensed at the input.

9. The method according to claim 8, wherein the SOI substrate has a first polarity, and the embedded conductor is created by doping a volume of the SOI substrate to a second, opposite polarity, the doped volume being located at the surface of the SOI substrate and being delimited by the SOI substrate of the first polarity and by the dielectric layer formed on the surface of the SOI substrate.

10. The method according to claim 8, wherein the SOI substrate has a first polarity, and the embedded conductor is created by doping a volume of the SOI substrate to a second, opposite polarity, the doped volume being located within the SOI substrate and being delimited on all sides by the SOI substrate of the first polarity.

11. The method according to claim 8, further comprising:
    providing contact holes in the dielectric layer for the first and second ends of the embedded conductor, wherein the contact holes comprise contact diffusions which connect the first and second ends of the embedded conductor, respectively, to the surface conductors.

12. The method according to claim 8, further comprising:
    providing a bonding area on the surface of the dielectric layer, the bonding area being located between the first and second ends of the embedded conductor; and
    sealing a top wafer onto the bonding area by a wafer bonding technique to create a hermetically sealed cavity containing the second end of the embedded conductor.

13. The method according to claim 8, further comprising:
    thinning the SOI substrate to form a mechanically sensitive membrane in the area containing the embedded resistor.

14. The method according to claim 8, further comprising:
    integrating the amplifier on the SOI substrate.

* * * * *